US008587458B2

(12) United States Patent
Abali et al.

(10) Patent No.: US 8,587,458 B2
(45) Date of Patent: Nov. 19, 2013

(54) UNPACKING A VARIABLE NUMBER OF DATA BITS

(75) Inventors: Bulent Abali, Tenafly, NJ (US); Bartholomew Blaner, Underhill Center, VT (US); John J. Reilly, Huntington, VT (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 13/313,833

(22) Filed: Dec. 7, 2011

(65) Prior Publication Data

US 2013/0147643 A1 Jun. 13, 2013

(51) Int. Cl.
*H03M 7/00* (2006.01)

(52) U.S. Cl.
USPC .............................................. 341/60; 341/61

(58) Field of Classification Search
USPC .................... 341/60, 87, 67, 81, 50, 107, 51; 382/238, 240, 233, 234, 247; 375/240.12, 240.25
See application file for complete search history.

(56) References Cited

U.S. PATENT DOCUMENTS

| | | | |
|---|---|---|---|
| 5,237,701 A | 8/1993 | Bertrand | |
| 5,631,848 A | 5/1997 | Laczko et al. | |
| 5,668,548 A | 9/1997 | Bakhmutsky | |
| 6,052,368 A | 4/2000 | Aybay | |
| 6,065,084 A | 5/2000 | Chatzigianis et al. | |
| 6,144,322 A | 11/2000 | Sato | |
| 6,173,366 B1 | 1/2001 | Thayer et al. | |
| 6,205,223 B1 | 3/2001 | Rao et al. | |
| 6,629,239 B1 | 9/2003 | Steele, Jr. | |
| 7,068,192 B1 | 6/2006 | Dean et al. | |
| 7,418,146 B2 * | 8/2008 | Watanabe et al. | 382/247 |
| 7,733,122 B2 * | 6/2010 | Yoshikawa et al. | 326/38 |

FOREIGN PATENT DOCUMENTS

| | | |
|---|---|---|
| EP | 0599418 A2 | 1/1994 |
| JP | 57207942 A | 12/1982 |
| JP | 4124724 A | 4/1992 |

OTHER PUBLICATIONS

International Search Report and Written Opinion dated Dec. 17, 2012 for Application No. PCT/US2012/057467, 13 pages.
"Discussion on Web for unpacking Variable Length Strings", Sep. 20, 2010, 1 page, url: http://stackoverflow.com/questions/3753589/packing-and-unpacking-variable-length-array-string-using-the-struct-module-in-pyt.

* cited by examiner

*Primary Examiner* — Joseph Lauture
(74) *Attorney, Agent, or Firm* — Michael Le Strange; Roberts Mlotkowski Safran & Cole, P.C.

(57) ABSTRACT

Unpacking a variable number of data bits is provided. A structure includes an input port operable to receive one or more input data units including a plurality of packed bits of data, each of the one or more input data units including a header and a payload, the header including a predetermined number of bits and identifying a format of the payload and a length of the payload, and the payload including a variable number of bits. The structure further includes a circuit operable to identify and unpack the one or more input data units based on the header and the payload of each of the one or more input data units. The structure further includes an output port operable to transmit one or more output data units including the unpacked one or more input data units, once per clock cycle.

20 Claims, 3 Drawing Sheets

UNPACKING A VARIABLE NUMBER OF DATA BITS

FIELD OF THE INVENTION

The invention relates to electronic computing and communication and, more particularly, to a method and apparatus for unpacking a variable number of data bits.

BACKGROUND

To transfer and store electronic computing data more efficiently, such data is often compressed into sizes smaller than their original sizes. Compressed data used in data transmission and storage typically includes variable-sized data units concatenated together. Fast conversion of this compressed data (e.g., unpacking of data bits) to an uncompressed, fixed-size data unit may be problematic, however.

For example, input data units may include 5 to 69 bits each, where the first 5 bits constitute a header which describes a format of a payload, and the next 0 bits to a maximum of 64 bits constitute the payload. Output data units may include unpacked, fixed-size data units of 64 bits each. Since variable-sized data units are concatenated together in the input data units, there is a sequential dependency between each of the input data units. That is, the first variable-sized data unit must be converted and size-determined before the second variable-sized data unit can be converted, the second variable-sized data unit must be converted and size-determined before the third variable-sized data unit can be converted, and so on.

In a particular example, three data units of 64 bits each, and of a total of 192 bits, in an uncompressed format, may include 27 bits in a compressed format and concatenated in the form of 5-bit, 11-bit, and 11-bit variable-sized data units, respectively. Uncompressing these three variable-sized data units with computing circuitry may be difficult since recognizing the bit boundaries of the variable-sized data units may require numerous, time-consuming tasks, e.g., first decoding the size of the first variable-sized data unit, then decoding the size of the second variable-sized data unit from the decoded size of the first variable-sized data unit, and so on. Further, each data unit conversion may require several clock cycles, thereby requiring many clock cycles to unpack the compressed data and making it unsuitable for high-speed electronic computation and communication.

Accordingly, there exists a need in the art to overcome the deficiencies and limitations described hereinabove.

SUMMARY

In a first aspect of the invention, a structure includes an input port operable to receive one or more input data units including a plurality of packed bits of data, each of the one or more input data units including a header and a payload, the header including a predetermined number of bits and identifying a format of the payload and a length of the payload, and the payload including a variable number of bits. The structure further includes a circuit operable to identify and unpack the one or more input data units based on the header and the payload of each of the one or more input data units. The structure further includes an output port operable to transmit one or more output data units including the unpacked one or more input data units, once per clock cycle.

In another aspect of the invention, a structure for unpacking a variable number of data bits, includes an input port operable to receive one or more input data units including a plurality of packed bits of data, each of the one or more input data units including a header and a payload, the header including a predetermined number of bits and identifying a format of the payload and a length of the payload, and the payload including a variable number of bits. The structure further includes a first stage pipeline register operable to rotate the plurality of packed bits of the one or more input data units, and a second stage pipeline register operable to determine the length of the payload of each of the rotated one or more input data units based on the header of each of the rotated one or more input data units. The structure further includes a decode and decompress unit operable to unpack the one or more input data units based on the determined length of the payload of each of the one or more input data units, and an output port operable to transmit one or more output data units including the unpacked one or more input data units, once per clock cycle.

In yet another aspect of the invention, a method of unpacking a variable number of data bits, includes receiving one or more input data units including a plurality of packed bits of data, each of the one or more input data units including a header and a payload, the header including a predetermined number of bits and identifying a format of the payload and a length of the payload, and the payload including a variable number of bits. The method further includes identifying and unpacking the one or more input data transmitting one or more output data units including the unpacked one or more input data units, once per clock cycle.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to electronic computing and communication and, more particularly, to a method and apparatus for unpacking a variable number of data bits. In embodiments, the present invention includes pipelined compression and decompression circuits used in communication and storage of data. More specifically, in aspects of the invention, the compression and decompression circuits unpack variable bits of compressed data in a pipelined fashion and to output one uncompressed data unit per clock cycle. Advantageously, by performing the various tasks for unpacking the variable bits of compressed data in parallel, the unpacking of the variable bits of compressed data occurs more efficiently and in every one clock cycle.

Figure 1:
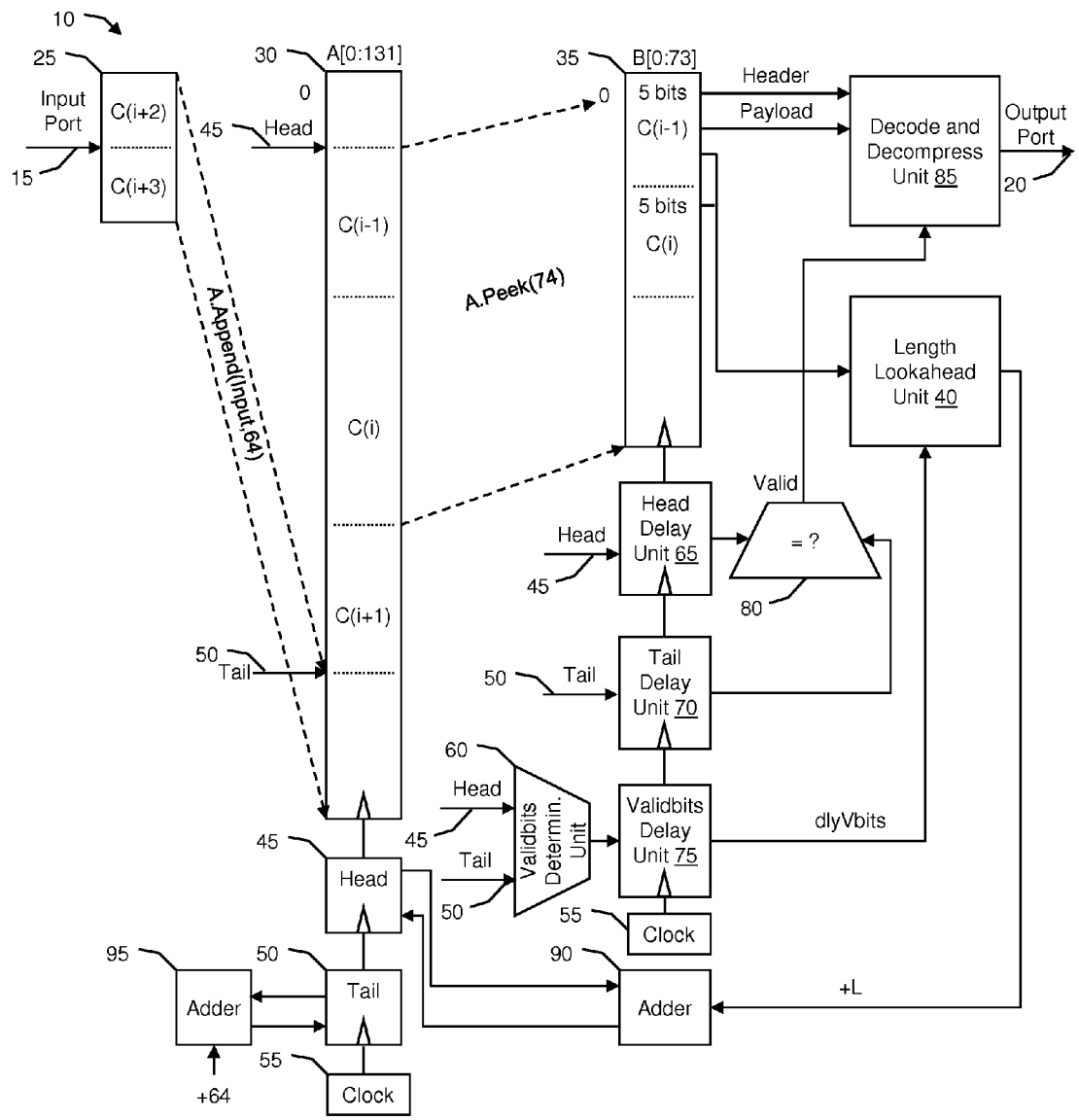
FIG. 1 shows an exemplary pipelined compression and decompression circuit for unpacking a variable number of data bits in accordance with aspects of the present invention.

FIG. 1 shows an exemplary pipelined compression and decompression circuit 10 for unpacking a variable number of data bits in accordance with aspects of the present invention. In embodiments, the compression and decompression circuit 10 includes an input port 15 and an output port 20, which are 64 bits wide, although other dimensions are contemplated by the invention. The compression and decompression circuit 10 further includes a plurality of registers, combinational logic, and state machines for decoding and decompressing compressed input data received through the input port 15 and initially stored in an input register 25. Input data units can be 5 to 69 bits long each (e.g., variable-sized), where the first 5 bits constitute a header which describes a format of a payload, and the next 0 bits to a maximum of 64 bits constitute the payload. Output data units may include unpacked, fixed-size data units of 64 bits each. The input data units may be further concatenated in an input bit stream with no gaps in between, and represented as C(0), C(1), ..., C(i−1), C(i), C(i+1), ..., C(last), where C(i) is the i-th variable-sized data unit. Since the input port 15 is 64 bits wide, a plurality of the input data units may arrive at the input port 15 in a same cycle, such as the input data units C(i+2) and C(i+3) stored in the input register 25. Since the input data units are not integral multiples of 64 bits, the input data units may arrive at the input port 15 at different clock cycles.

In embodiments, the compression and decompression circuit 10 can include a two-stage pipeline including a holding register 30 (e.g., a holding register A) and a register 35 (e.g., a register B), and a length lookahead unit 40 (e.g., a header size lookahead function), to enable pipelined operation. More specifically, the holding register 30 may be a circular queue or buffer of the input data units, and may be 132 bits wide, e.g., include bits A[0:131]. A head register 45 (e.g., a head register A) includes a pointer which points to a first occupied bit location in the holding register 30. A tail register 50 (e.g., a tail register A) includes a pointer which points to a first free bit location or position in the holding register 30. When the head register 45 points to a same location or position as the tail register 50, the holding register 30 is empty. The pointer values of the head and tail registers 45 and 50 may be sent to other components of the compression and decompression circuit 10 as discussed herein. A clock 55 may control operation of the holding register 30, the head register 45, and the tail register 50 at a predetermined clock rate. For example, as shown in FIG. 1, the holding register 30 may include the input data units C(i−1), C(i), and C(i+1), the head register 45 may point to a first occupied bit location of the input data unit C(i−1), and the tail register 50 may point to a first free bit location after the input data unit C(i+1).

In accordance with further aspects of the invention, the holding register 30 can rotate input and output values to align the variable-sized input data units in desirable bit positions for subsequent use by subsequent pipeline stages. More specifically, in embodiments, a rotator function A.append(value, nbits) of the holding register 30 may append an input value (e.g., "value") into the holding register 30 starting from the position of the tail register 50 (e.g., "tail") until the position of the tail register 50 added by a number of bits (e.g., "nbits") of the input value (e.g., the input value is appended into bits A[tail:tail+nbits]). For example, a rotator function A.append (input C(i+2) and C(i+3), 64), where an input value includes the input data bits C(i+2) and C(i+3) and a number of bits is 64, may append the input data bits C(i+2) and C(i+3) into the holding register 30 starting from the position of the tail register 50 that is after the input data bit C(i+1) in the holding register 30. The rotator function of the holding register 30 may further update the position of the tail register 50 based on the following equation:

$$\text{tail} = (\text{tail} + \text{nbits}) \bmod \text{sizeof}(A) \quad (1),$$

where tail is the position of the tail register 50, nbits is the number of bits of the input value, and sizeof(A) is a bit size of the register A or the holding register 30.

In embodiments, another rotator function A.peek(nbits) of the holding register 30 may read a number of bits (e.g., "nbits") as an output value from the holding register 30 starting from the position of the head register 45 until the position of the head register 45 added by the number of bits (e.g., the output value is read from bits A[head:head+nbits]). For example, a rotator function A.peek(74), where a number of bits read from the holding register 30 is 74, may read the input data bits C(i−1) and C(i) from the holding register 30 starting from the position of the head register 45 until the position of the head register 45 added by the number of bits. The rotator function A.peek(nbits) implies a rotator logic which rotates the output value down from the position of the head register 45 to zero or a first bit location in the register 35.

In accordance with further aspects of the invention, the register 35 can be 74 bits wide, e.g., include bits B[0:73], since a largest possible input data unit size is 69 bits for a payload plus a header of a first input data unit plus 5 bits for a header of a second input data unit. The register 35 may receive the output value (e.g., of the function A.peek(nbits)) from the holding register 30, and align the output value in the register 35 starting from the first bit location. For example, the register 35 may receive the input data bits C(i−1) and C(i) from the holding register 30, and align the input data bits C(i−1) and C(i) starting from the first bit location in the register 35. A function B.current_chunk_len( ) operates on the register 35 (e.g., the register B) and may determine a length of a current input data unit, including a header of the current input data unit, in the register 35 based on the header (e.g., first 5 bits) of the current input data unit. For example, the function B.current_chunk_len( ) may determine a length of the input data unit C(i−1) in the register 35, including a header of the input data unit C(i−1), e.g. first 5 bits of C(i−1). That is, the function B.current_chunk_len( ) is used to find a boundary between the current input data unit (e.g., the input data unit C(i−1)) and a next input data unit (e.g., the input data unit C(i)) in the register 35.

In embodiments, the pipelined compression and decompression circuit 10 can further include a valid bits determination unit 60, a head delay unit 65, a tail delay unit 70, a valid bits delay unit 75, and a comparator 80. The valid bits determination unit 60 may receive the positions of the head register 45 and the tail register 50, and based on these positions, a function A.validbits( ) of the valid bits determination unit 60 may determine a number of occupied bits (e.g. valid bits) in the holding register 30. The determination of the number of valid bits "validbits" in the holding register 30 may be based on the following equation:

$$\text{validbits} = \text{tail} - \text{head} \pmod{132} \quad (2).$$

In accordance with further aspects of the invention, the number of valid bits is determined so that the pipelined compression and decompression circuit 10 can determine whether the decompression operation is complete (e.g., whether the holding register 30 is empty), and thus, whether the length lookahead unit 40 should further perform its functions as described herein. The head delay unit 65, the tail delay unit 70, and the valid bits delay unit 75 can receive and delay by one clock cycle the position of the head register 45, the position of the tail register 50, and the number of valid bits in the holding register 30, respectively. The delayed position of the head register 45, the delayed position of the tail register 50, and the delayed number of valid bits in the holding register 30 may be represented as "dlyHead", "dlyTail", and "dlyVbits", respectively. The clock 55 may control operation of the register 35, the head delay unit 65, the tail delay unit 70, and the valid bits delay unit 75 at a predetermined clock rate.

In embodiments, the comparator 80 may receive the delayed positions of the head register 45 and the tail register 50 from the head delay unit 65 and the tail delay unit 70, respectively. The comparator 80 may determine whether the delayed positions of the head register 45 and the tail register 50 are equal to each other, which indicates whether the holding register 30 is empty. When the delayed positions of the head register 45 and the tail register 50 are not equal to each other (e.g., the holding register 30 is not empty), the comparator 80 sends an asserted valid signal to a decode and decompress unit 85. Otherwise, the comparator 80 sends a non-asserted valid signal to the decode and decompress unit 85.

In embodiments, based on the determined length of the current input data unit, the register 35 can send the header of the current input data unit and a payload (e.g., a remaining portion or body) of the current input data unit to the decode and decompress unit 85. When the decode and decompress unit 85 receives the asserted valid signal from the comparator 80, the decode and decompress unit 85 may convert the variable-sized, compressed current input data unit into a fixed-size, uncompressed output data unit of 64 bits which is outputted by the output port 20. For example, based on the determined length of the input data unit $C(i-1)$, the register 35 may send the header of the input data unit $C(i-1)$ and a data unit of the input data unit to the decode and decompress unit 85 which may convert the input data unit $C(i-1)$ for output. When the decode and decompress unit 85 receives the non-asserted valid signal from the comparator 80, the decode and decompress unit 85 does nothing.

In accordance with further aspects of the invention, the length lookahead unit 40 is a combinatorial logic of 74 inputs that can receive the current input data unit (e.g., the input data unit $C(i-1)$) and the next input data unit (e.g., the input data unit $C(i)$) from the register 35. The length lookahead unit 40 may further receive the delayed valid bits (e.g., occupied bits) in the holding register 30 from the valid bits delay unit 75. When the delayed valid bits is greater than or equal to the length of the current input data unit (including the header of the current input data unit) determined based on the header of the current input data unit, the length lookahead unit 40 (e.g., via a lookaheadChunkLength(B) function) may use the length of the current input data unit to find a header of the next input data unit, and use the header of the next input data unit to determine the length of the next input data unit. When the delayed valid bits are not greater than or equal to the length of the current input data unit, the length lookahead unit 40 may determine the length of the next input data unit to be zero.

In embodiments, the length lookahead unit 40 may send the length of the next input data unit to an adder 90 which in a next clock cycle, may receive the position of the head register 45 and add the position of the head register 45 to the length of the next input data unit. The adder 90 may set this sum value as a new position of the head register 45, to point to a first occupied bit location of a next input data unit (e.g., the input data unit $C(i+1)$) in the holding register 30. The incrementing of the position of the head register 45 may be determined based on the following equation:

$$\text{head}=\text{head}+L(\text{mod }132) \quad (3),$$

where L is the length of the next input data unit.

In accordance with further aspects of the invention, in the same next clock cycle, an adder 95 can receive and increment the position of the tail register 50 by 64 bits. The adder 95 may set this incremented value as a new position of the tail register 50, to point to a first free bit location in the holding register 30, e.g., after the input data unit $C(i+3)$ which is to be appended into the holding register 30. The adders 90 and 95 are used to increment the positions of the head register 45 and the tail register 50, respectively, to boundaries of the input data units such that they are subsequently sent to the decode and decompress unit 85 in a proper order.

In embodiments, each of the functions of the registers 30 and 35, the decode and decompress unit 85, the length lookahead unit 40, the adder 90, and the head register 45 can be performed in parallel and in the same clock cycle, e.g., as represented in pseudocode as "DO IN PARALLEL". Advantageously, a 64-bit, decompressed output data unit is efficiently produced every cycle, instead of after multiple cycles.

In accordance with further aspects of the invention, the functions of the components in the pipelined compression and decompression circuit 10 may be represented by the following exemplary pseudocode:

```
DO IN PARALLEL
    A.append(input,64) on clock edge // rotate input up to tail;
    tail←tail+64(mod132)
    nextB ← A.peek(74) // rotate down from head
    B ← nextB on clock edge
    if( dlyHead != dlyTail AND dlyVbits >=
    B.current_chunk_length( ) )
        Output ← decompress(B[0..])
    else
        Output ← invalid // don't care
    if( Head != Tail AND dlyVbits >= B.current_chunk_length( )) //
    current means
    C(i-1)
        L ← lookaheadChunkLength(B)
    else
        L ← 0
    nextHead ← head+L (mod 132)
    head ← nextHead on clock edge
END
```

Figure 2:
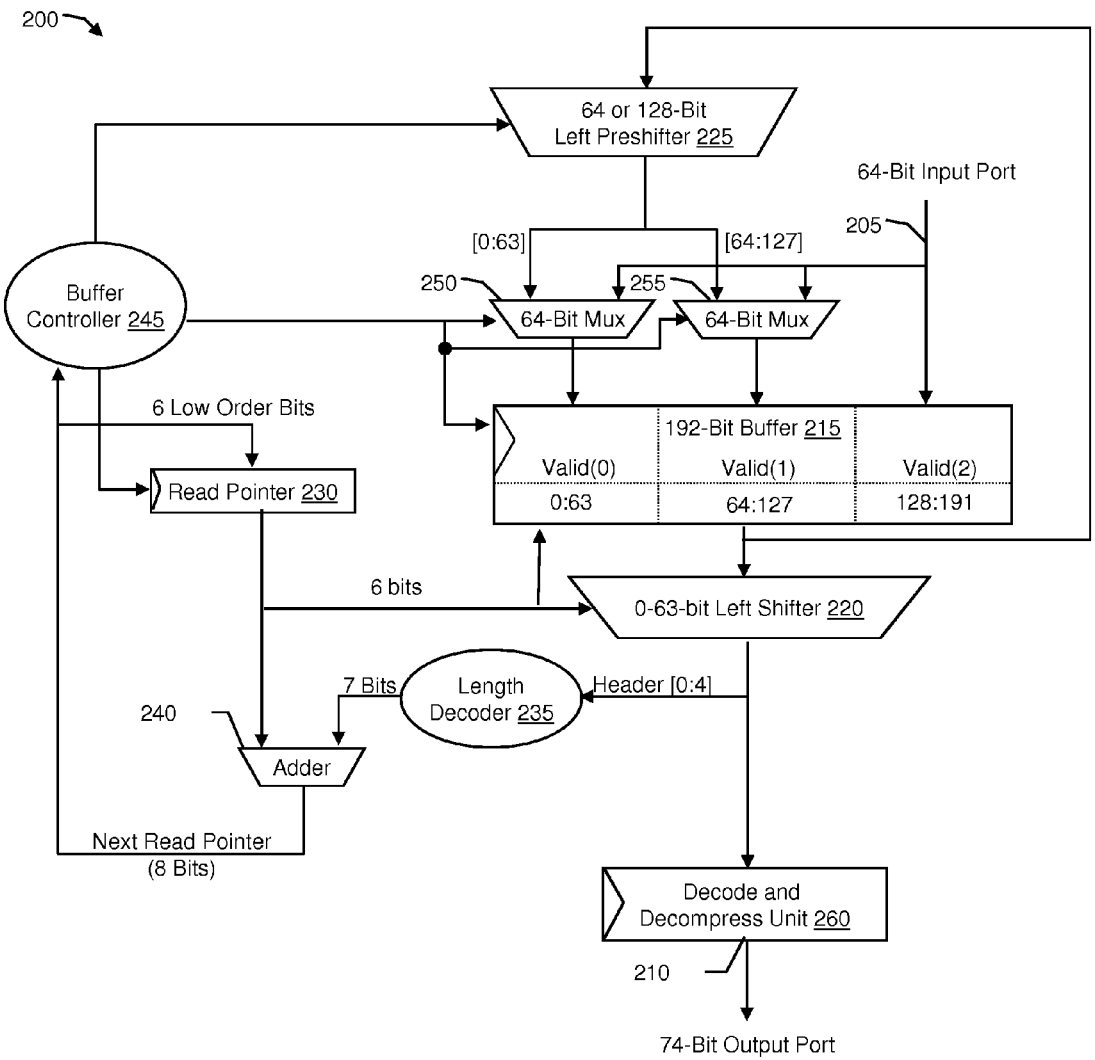
FIG. 2 shows another exemplary pipelined compression and decompression circuit for unpacking a variable number of data bits in accordance with aspects of the present invention.

FIG. 2 shows another exemplary pipelined compression and decompression circuit 200 for unpacking a variable number of data bits in accordance with aspects of the present invention. In embodiments, the compression and decompression circuit 200 includes a 64-bit input port 205 and a 74-bit output port 210, although other dimensions are contemplated by the invention. The compression and decompression circuit 200 further includes a plurality of registers, combinational logic, and state machines for decoding and decompressing compressed input data received through the input port 205. Input data units can be 5 to 69 bits long each (e.g., variable-sized), where the first 5 most significant bits constitute a header which describes a format of a payload, and the next 0 bits to a maximum of 64 bits constitute the payload. The input data units may be further concatenated in an input bit stream with no gaps in between. Output data units may include unpacked, fixed-size data units of 74 bits each, which include a 5-bit header of a current payload, the 64-bit payload, and a 5-bit header of a next payload.

In embodiments, the compression and decompression circuit 200 can further include a 192-bit buffer 215, a 0-to-63-bit left shifter 220, a selectable 64-bit or 128-bit left preshifter 225, a read pointer register 230, a length decoder 235, a next read pointer adder 240, a buffer controller 245, a 64-bit multiplexer 250, a 64-bit multiplexer 255, and a decode and decompress unit 260. The 192-bit buffer 215 may receive a 64-bit input data unit from the input port 205, and store the input data unit into any of three 64-bit sections (e.g., including bits [0:63], bits [64:127], and bits [128:191], respectively) of the 192-bit buffer 215. Data valid bits (e.g., Valid(0), Valid(1), and Valid(2)) are associated with each of the respective 64-bit sections of the 192-bit buffer 215. The read pointer register 230 may include a read pointer which indicates or points to a starting point or bit location of the input data unit in the 192-bit buffer 215, namely, within the first 64-bit section, the bits [0:63], of the 192-bit buffer 215. The 192-bit buffer 215 may send the data in the 192-bit buffer 215 (e.g., including the input data unit) to both the left shifter 220 and the left preshifter 225.

In accordance with further aspects of the invention, the 0-to-63 bit left shifter 220 can left shift the received data of the 192-bit buffer 215 by 0-to-63 bits based on the read pointer of the read pointer register 230. For example, the left shifter 220 may left shift the bit pointed by the read pointer by 0-to-63 bits such that the bit is at a first bit location (e.g., is the most significant bit) in the left shifter 220. All bits following the bit pointed by the read pointer may also be shifted left by 0-to-63 bits. The left shifter 220 may send a header (e.g., first 5 most significant bits) of the shifted input data unit to a length decoder 235 which may determine a length of the input data unit in the 192-bit buffer 215. The length decoder 235 may send the 7-bit length of the input data unit to the adder 240.

In embodiments, the adder 240 can receive the length of the input data unit in the 192-bit buffer 215 from the length decoder 235, and the 6-bit starting point of the input data unit in the 192-bit buffer 215 (e.g., the read pointer) from the read pointer register 230. The adder 240 may add the length of the input data unit to the starting point of the input data unit to determine an 8-bit next starting point or bit location of a next input data unit in the 192-bit buffer 215 (e.g., a next read pointer). The adder 240 may send the next read pointer to the buffer controller 245. The adder 240 may further send 6 lower order bits of the next read pointer to the read pointer register 230 which may set the current read pointer to the next read pointer when the buffer controller 245 determines the next input data unit is valid, e.g., entirely within one of the three 64-bit sections of the 192-bit buffer 215.

In accordance with further aspects of the invention, the buffer controller 245 can control operation of the 192-bit buffer 215, the 64-bit or 128-bit left preshifter 225, the 64-bit multiplexer 250, and the 64-bit multiplexer 255 at a predetermined clock rate. More specifically, the 64-bit or 128-bit left preshifter 225 may receive the data in the 192-bit buffer 215. Based on the next read pointer received from the adder 240, the buffer controller 245 may instruct the left preshifter 225 to left shift the received data from the 192-bit buffer 215 by 64 bits or 128 bits. For example, the left preshifter 225 may left shift the received data from the 192-bit buffer 215 by 64 bits or 128 bits such that a first bit location of the next input data is contained within bits [0:63] of the left preshifter 225.

In embodiments, when the next read pointer is pointing at a bit location that is greater than a $127^{th}$ bit in the 192-bit buffer 215 (e.g., the next input data starts in the third 64-bit section, the bits [128:191], of the 192-bit buffer that includes the least significant bit "lsb"), the 64-bit or 128-bit left preshifter 225 can left shift the data from the 192-bit buffer 215 by 128 bits. When the next read pointer is pointing at a bit location that is less than a $128^{th}$ bit but greater than a $63^{rd}$ bit, in the 192-bit buffer 215 (e.g., the next input data starts in the second 64-bit section, the bits [64:127], of the 192-bit buffer), the left preshifter 225 may left shift the data from the 192-bit buffer 215 by 64 bits. When the next read pointer is pointing at a bit location that is less than a $64^{th}$ bit in the 192-bit buffer 215 (e.g., the next input data starts in the first section, the bits [0:63], of the 192-bit buffer), the left preshifter 225 does not left shift the data from the 192-bit buffer 215. These functions or actions of the left preshifter 225 may be summarized by the following table:

TABLE 1

| Next Read Pointer (NRP) | Action |
| --- | --- |
| $127^{th}$ Bit < NRP | Shift Left 128 Bits |
| $63^{rd}$ Bit < NRP < $128^{th}$ Bit | Shift Left 64 Bits |
| NRP < $64^{th}$ Bit | No Shift Left |

In accordance with further aspects of the invention, the 64-bit or 128-bit left preshifter 225 can send a first 64 or least significant bits (e.g., bits [64:127]) of the shifted or non-shifted data in the left preshifter 225 to the 64-bit multiplexer 255. The left preshifter 225 may send a second 64 or most significant bits (e.g., bits [0:63]) of the shifted or non-shifted data in the left preshifter 225 to the 64-bit multiplexer 250. The 64-bit multiplexer 255 and the 64-bit multiplexer 250 may further receive the input data unit from the input port 205. Based on the buffer valid bits and the value of the next read pointer, the buffer controller 245 may instruct the 64-bit multiplexers 255 and 250 to output the shifted data from the preshifter 225 or the input data unit from the input port 205, to the 192-bit buffer 215, as discussed herein.

Figure 3:
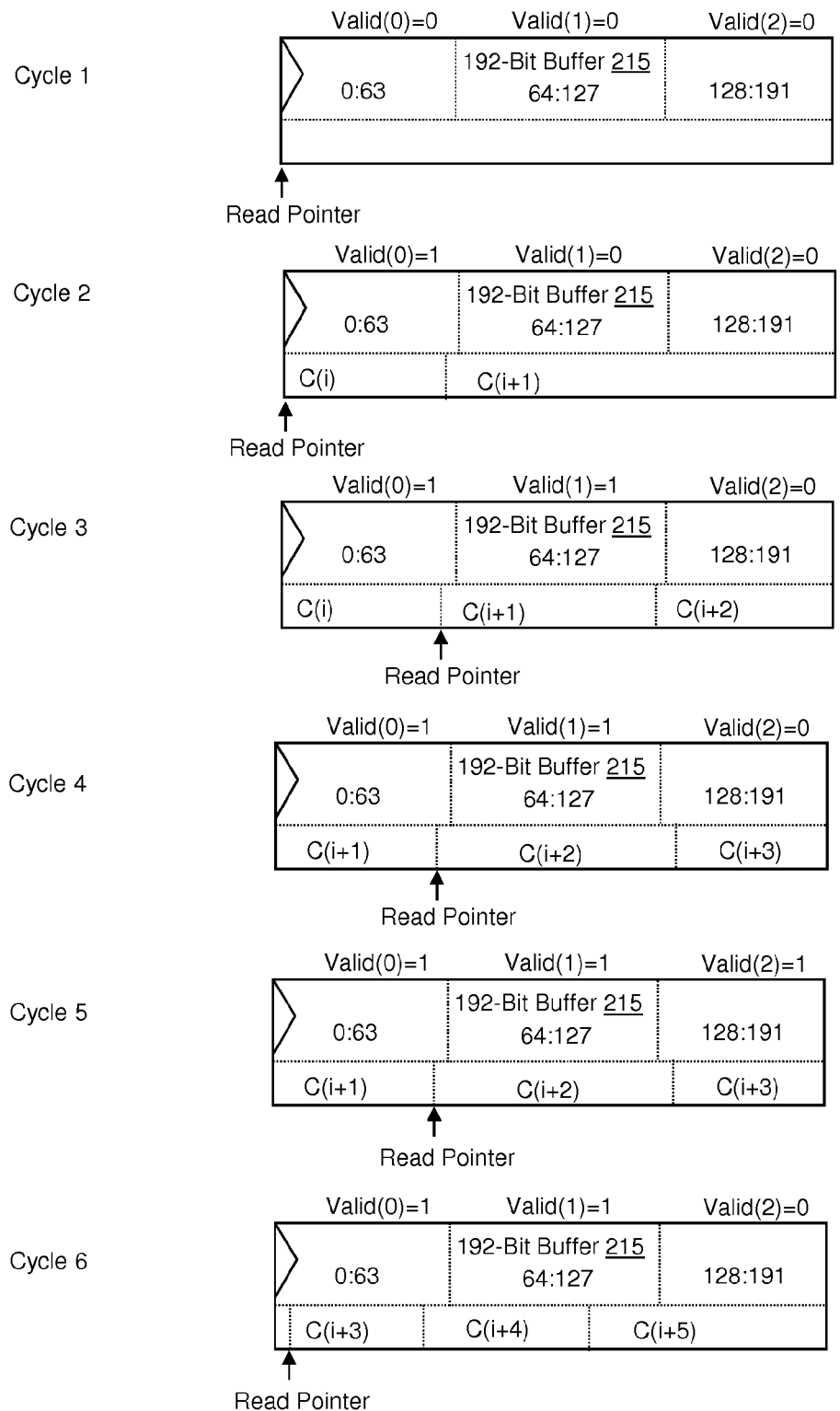
FIG. 3 shows an exemplary cycle-by-cycle diagram of a 192-bit buffer in FIG. 2 and contents in the 192-bit buffer in accordance with aspects of the present invention.

FIG. 3 shows an exemplary cycle-by-cycle diagram of the 192-bit buffer 215 in FIG. 2 and contents in the 192-bit buffer 215 in accordance with aspects of the present invention. In each cycle, a read pointer (in the read pointer register 230 in FIG. 2) indicates or points to a starting point or bit location of a next, variable-length input data unit in the 192-bit buffer 215, e.g., where a header of the next input data unit begins. C(i) is a first input data unit in a data stream, followed by an input data unit C(i+1), and so on.

In cycle 1, at the beginning of the sequence, the 192-bit buffer 215 is empty. This is indicated by all three valid bits (e.g., Valid(0), Valid(1), and Valid(2)) of the 192-bit buffer 215 being cleared. The valid bits Valid(0), Valid(1), and Valid(2) indicates whether a first section (e.g., bits [0:63]), a second section (e.g., bits [64:127]), and a third section (e.g., bits [128:191]), respectively, of the 192-bit buffer 215 includes bits of data. Input data (e.g., the first input data unit C(i)) is written into the 192-bit buffer 215 at the bits [0:63], and the first valid bit Valid(0) is set.

In cycle 2, the bits [0:63] of the 192-bit buffer 215 have valid data, namely, the first input data unit C(i). The 0-63-bit left shifter 220 in FIG. 2 performs a shift equal to the read pointer value of zero. The length decoder 235 in FIG. 2 determines a length of the first input data unit C(i). The adder 240 in FIG. 2 determines a next read pointer which the buffer controller 245 uses to determine that the first input data unit C(i) is entirely contained within a valid 64-bit section (e.g., the bits [0:63]) of the 192-bit buffer 215. The output of the 0-63-bit left shifter 220 is passed to the decode and decompress unit 260, and the read pointer may advance to the next read pointer. No preshifting occurs since the next read pointer is at a bit location less than a 64th bit in the 192-bit buffer 215. Input data (e.g., the input data unit C(i+1)) is written into 192-bit buffer 215 at the bits [64:127] and the second valid bit Valid(1) is set.

In cycle 3, the bits [0:127] of the 192-bit buffer 215 have valid data. In a fashion identical to cycle 2, the next read pointer is calculated, the buffer controller 245 determines that the input data unit C(i+1) is entirely within valid 64-bit sections (e.g., the bits [0:127]), and the read pointer may advance to the next read pointer. Since next read pointer is at a bit location less than a $128^{th}$ bit but greater than a $63^{rd}$ bit in the 192-bit buffer 215, the buffer controller 245 instructs the 64 or 128-bit left preshifter 225 and the multiplexer 250 to perform a 64-bit preshift operation. More specifically, the bits [64:

127] in the 192-bit buffer 215 are moved to the bits [0:63], and the valid bit Valid(1) is moved to the valid bit Valid(0). Input data (e.g., an input data unit C(i+2)) is written into the empty bits [64:127] in the 192-bit buffer 215, and the valid bit Valid(1) is set.

In cycle 4, the bits [0:127] in the 192-bit buffer 215 have valid data. The next read pointer is calculated, and the buffer controller 245 determines that input data unit C(i+2) is not entirely valid, e.g., within valid 64-bit sections (e.g., the bits [0:127]) of the 192-bit buffer 215. The read pointer cannot be updated and the output of the 0-63-bit left shifter 220 cannot be used yet. Input data (e.g., an input data unit C(i+3)) is written to the bits [128:191] of the 192-bit buffer 215, and the valid bit Valid(2) is set.

In cycle 5, all of the bits [0:191] of the 192-bit buffer 215 have valid data. The next read pointer is calculated, the buffer controller 245 determines that the input data unit C(i+2) is entirely valid within valid 64-bit sections (e.g., the bits [0:191]), and the read pointer can be advanced to the next read pointer. Since next read pointer is at a bit location greater than a $127^{th}$ bit in the 192-bit buffer 215, the buffer controller 245 instructs the 64 or 128-bit left preshifter 225 and the multiplexer 250 to perform a 128-bit preshift operation. More specifically, the bits [128:191] in the 192-bit buffer 215 are moved to the bits [0:63], leaving only the valid bit Valid(0) set. Input data (e.g., an input data unit C(i+4)) is written to the empty bits [64:127] of the 192-bit buffer 215, and the valid bit Valid(1) is set.

In cycle 6, the bits [0:127] in the 192-bit buffer 215 have valid data. The next read pointer is calculated, the buffer controller 245 determines that chunk C(i+3) is entirely valid within the valid bit section (e.g., the bits [0:63]), and the read pointer can be advanced to the next read pointer. No preshift is performed since the next read pointer is at a bit location less than the $64^{th}$ bit in the 192-bit buffer 215. Input data (e.g., an input data unit C(i+5)) is written to the bits [128:191] in the 192-bit buffer 215, and the valid bit Valid(2) is set.

Referring back to FIG. 2, in embodiments, the decode and decompress unit 260 can receive and convert the variable-sized, compressed input data unit from the 0-to-63 bit left shifter 220 into a fixed-size, uncompressed output data unit of 64 bits which is outputted by the output port 210. Each of the components of the compression and decompression circuit 200 can perform its function(s) in parallel and in the same clock cycle. Advantageously, a 64-bit, decompressed output data unit is efficiently produced every cycle, instead of after multiple cycles.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    an input port operable to receive one or more input data units comprising a plurality of packed bits of data, each of the one or more input data units comprising a header and a payload, the header comprising a predetermined number of bits and identifying a format of the payload and a length of the payload, and the payload comprising a variable number of bits;
    a circuit operable to identify and unpack the one or more input data units based on the header and the payload of each of the one or more input data units; and
    an output port operable to transmit one or more output data units comprising the unpacked one or more input data units, once per clock cycle.

2. The structure of claim 1, further comprising a first stage pipeline register operable to rotate the plurality of packed bits of the one or more input data units.

3. The structure of claim 2, further comprising a second stage pipeline register operable to determine the length of the payload of each of the rotated one or more input data units based on the header of each of the rotated one or more input data units.

4. The structure of claim 3, further comprising a decode and decompress unit operable to unpack the one or more input data units based on the determined length of the payload of each of the one or more input data units.

5. The structure of claim 3, further comprising a length lookahead unit operable to determine a length of a payload of a next input data unit of the rotated one or more input data units based on a determined length of a payload of a current input data unit of the rotated one or more input data units.

6. The structure of claim 1, further comprising:
    a 192-bit buffer operable to receive the one or more input data units; and
    a read pointer register operable to indicate a starting point of the one or more input data units in the 192-bit buffer.

7. The structure of claim 6, further comprising:
    a 0-to-63-bit shifter operable to shift the one or more input data units based on the starting point of the one or more input data units; and
    a length decoder operable to determine a length of a payload of a current input data unit of the shifted one or more input data units based on a header of the current input data unit.

8. The structure of claim 7, further comprising:
    a next read pointer adder operable to determine a next read pointer which indicates a next starting point of the one or more input data units in the 192-bit buffer based on the starting point of the one or more input data units and the determined length of the payload of the current input data unit; and
    a 64-bit or 128-bit preshifter operable to shift the one or more input data units in the 192-bit buffer based on the next starting point of the one or more input data units.

9. The structure of claim 8, wherein:
    the next starting point of the one or more input data units is greater than a $127^{th}$ bit in the 192-bit buffer; and the 64-bit or 128-bit preshifter shifts the one or more input data units in the 192-bit buffer by 128 bits.

10. The structure of claim 8, wherein:
the next starting point of the one or more input data units is greater than a $63^{rd}$ bit and less than a $128^{th}$ bit, in the 192-bit buffer; and
the 64-bit or 128-bit preshifter shifts the one or more input data units in the 192-bit buffer by 64 bits.

11. A structure for unpacking a variable number of data bits, comprising:
an input port operable to receive one or more input data units comprising a plurality of packed bits of data, each of the one or more input data units comprising a header and a payload, the header comprising a predetermined number of bits and identifying a format of the payload and a length of the payload, and the payload comprising a variable number of bits;
a first stage pipeline register operable to rotate the plurality of packed bits of the one or more input data units;
a second stage pipeline register operable to determine the length of the payload of each of the rotated one or more input data units based on the header of each of the rotated one or more input data units;
a decode and decompress unit operable to unpack the one or more input data units based on the determined length of the payload of each of the one or more input data units; and
an output port operable to transmit one or more output data units comprising the unpacked one or more input data units, once per clock cycle.

12. The structure of claim 11, further comprising:
a length lookahead unit operable to determine a length of a payload of a next input data unit of the rotated one or more input data units based on a determined length of a payload of a current input data unit of the rotated one or more input data units; and
an adder operable to increment a head pointer register by the determined length of the payload of the next input data unit such that the head pointer register indicates a starting point of the one or more input data units in the first stage pipeline register.

13. A method of unpacking a variable number of data bits, comprising:
receiving one or more input data units comprising a plurality of packed bits of data, each of the one or more input data units comprising a header and a payload, the header comprising a predetermined number of bits and identifying a format of the payload and a length of the payload, and the payload comprising a variable number of bits;
identifying and unpacking the one or more input data units based on the header and the payload of each of the one or more input data units; and
transmitting one or more output data units comprising the unpacked one or more input data units, once per clock cycle.

14. The method of claim 13, further comprising rotating the plurality of packed bits of the one or more input data units.

15. The method of claim 14, further comprising determining the length of the payload of each of the rotated one or more input data units based on the header of each of the rotated one or more input data units.

16. The method of claim 15, further comprising unpacking the one or more input data units based on the determined length of the payload of each of the one or more input data units.

17. The method of claim 15, further comprising determining a length of a payload of a next input data unit of the rotated one or more input data units based on a determined length of a payload of a current input data unit of the rotated one or more input data units.

18. The method of claim 13, further comprising indicating a starting point of the one or more input data units in a 192-bit buffer.

19. The method of claim 18, further comprising:
shifting the one or more input data units based on the starting point of the one or more input data units; and
determining a length of a payload of a current input data unit of the shifted one or more input data units based on a header of the current input data unit.

20. The method of claim 19, further comprising:
determining a next read pointer which indicates a next starting point of the one or more input data units in the 192-bit buffer based on the starting point of the one or more input data units and the determined length of the payload of the current input data unit; and shifting the one or more input data units in the 192-bit buffer based on the next starting point of the one or more input data units.

* * * * *